(12) United States Patent
Leutgeb et al.

(10) Patent No.: US 9,673,822 B2
(45) Date of Patent: Jun. 6, 2017

(54) SINGLE WIRE INTERFACE

(71) Applicant: Infineon Technologies AG, Neubiberg (DE)

(72) Inventors: Thomas Leutgeb, Lieboch (AT); Walter Kargl, Graz (AT); Helmut Koroschetz, Lieboch (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/684,594

(22) Filed: Apr. 13, 2015

(65) Prior Publication Data

US 2016/0301394 A1   Oct. 13, 2016

(51) Int. Cl.
 *H03K 19/09*   (2006.01)
 *H03K 19/094*   (2006.01)
 *H03K 19/0185*   (2006.01)

(52) U.S. Cl.
 CPC ........... *H03K 19/09429* (2013.01); *H03K 19/018521* (2013.01)

(58) Field of Classification Search
 CPC .. H03K 17/102; H03K 17/162; H03K 17/164; H03K 17/223; H03K 19/02; H03K 19/1776; H03K 21/08; H03K 21/17
 USPC ............... 327/185, 198, 199, 200, 202, 203
 See application file for complete search history.

(56) References Cited

U.S. PATENT DOCUMENTS

| | | | |
|---|---|---|---|
| 6,452,428 B1* | 9/2002 | Mooney | H03K 17/164 326/30 |
| 2010/0148836 A1* | 6/2010 | Zlatanovici | H03K 3/356165 327/199 |

* cited by examiner

*Primary Examiner* — John Poos
(74) *Attorney, Agent, or Firm* — Schiff Hardin LLP

(57) ABSTRACT

A system including a first device having a push-pull circuit configured to transmit a synchronization symbol; and a second device coupled to the first device by a single wire interface, and configured to, in response to receiving the synchronization symbol, transmit a data symbol to the first device while the push-pull circuit is in a tristate phase.

20 Claims, 3 Drawing Sheets

SINGLE WIRE INTERFACE

BACKGROUND

Single wire interfaces, which transfer power and transfer data bidirectionally between devices, are limited in terms of power supply and/or data rate. These interfaces are generally implemented using an open drain/collector circuit having a pull-up resistor coupled to a supply voltage. With a high pull-up resistor, the current consumption of a slave device is limited. With a low pull-up resistor, the current consumption of the slave device may be higher, but during data communication the slave device requires a strong current sink. The pull-up resistor, together with parasitic capacitances, has a long time constant limiting the data rate.

DETAILED DESCRIPTION

The present disclosure is directed to a system including a master device having a push-pull circuit configured to transmit a synchronization symbol; and a slave device coupled to the master device by a single wire interface, and configured to, in response to receiving the synchronization symbol, transmit a data symbol to the master device while the push-pull circuit is in a tristate phase. The system thus has a push/pull driver structure in both communication directions, combined with a synchronized weak driving period during the slave to master device communication.

Figure 1:
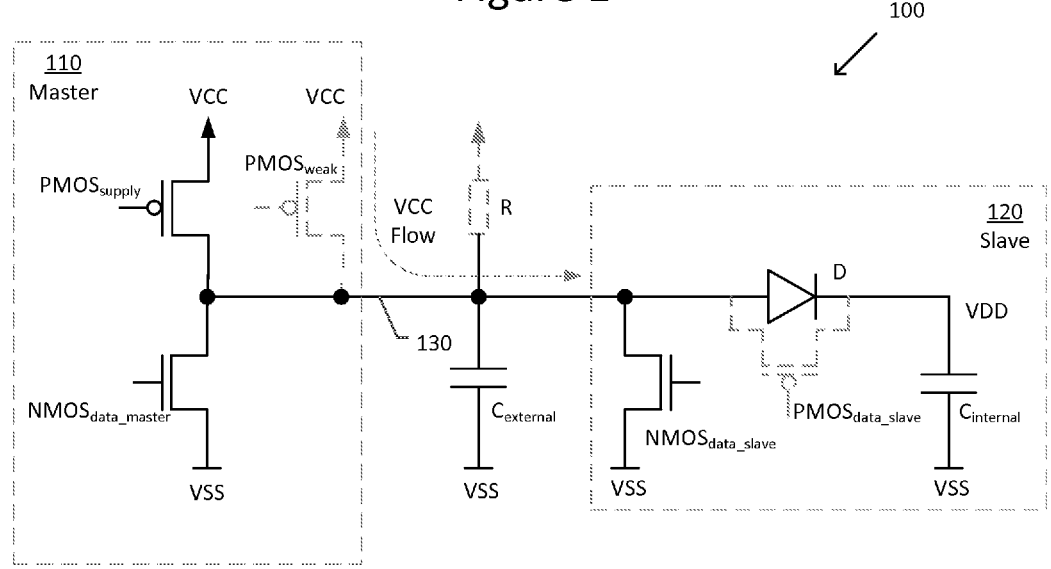
FIG. 1 illustrates a circuit diagram of a system in accordance with an exemplary embodiment.

FIG. 1 illustrates a circuit diagram of a system 100 in accordance with an exemplary embodiment.

The system 100 includes a master (or first) device 110 coupled to a slave (or second) device 120 via a single wire interface 130. An external capacitor $C_{external}$ is coupled between the single wire interface 130 and a source voltage VSS. An optional pull-up resistor R is coupled between the single wire interface 130 and a supply voltage VCC, and is configured to prevent the single wire interface 130 from floating. The dotted line arrow labeled "VCC flow" indicates a supply voltage path when the master device 110 supplies power to the external capacitor $C_{external}$ and the slave device 120.

The master device 110 includes a push-pull circuit comprising a supply transistor $PMOS_{supply}$ and a data transistor $NMOS_{data\_master}$ to alternately supply current to, or absorb current from the external capacitor $C_{external}$. The supply transistor $PMOS_{supply}$ is coupled between the supply voltage VCC and the single wire interface 130. The data transistor $NMOS_{data\_master}$ is coupled between the single wire interface 130 and the source voltage VSS. The supply transistor $PMOS_{supply}$ and the data transistor $NMOS_{data\_master}$ have opposing polarities, and in the exemplary embodiment, the supply transistor $PMOS_{supply}$ is a PMOS transistor and the data transistor $NMOS_{data\_master}$ is an NMOS transistor.

The slave device 120 includes a pull-down transistor $NMOS_{data\_slave}$, a diode D, an internal capacitor $C_{internal}$, and optionally an internal supply transistor $PMOS_{data\_slave}$. The pull-down transistor $NMOS_{data\_slave}$ is coupled between the single wire interface 130 and the source voltage VSS. The diode D is coupled between the single wire interface 130 and the internal capacitor $C_{internal}$, which is in turn coupled to the source voltage VSS. The diode D is configured to hinder the internal capacitor $C_{internal}$ from discharging during a lower voltage on the single wire interface 130. The optional internal supply transistor $PMOS_{data\_slave}$ is coupled in parallel with the diode D, and is configured to supply the external line capacitor $C_{external}$, as described further below.

The master device 110's push-pull circuit is configured to transfer both power and data over the single wire interface 130. More specifically, the push-pull circuit is configured to transfer power to the slave device 120 and the external capacitor $C_{external}$ when the supply transistor $PMOS_{supply}$ is on and the data transistor $NMOS_{data\_master}$ is off. In this state, current is pulled from the VCC along the VCC flow path as indicated by the dotted line arrow in FIG. 1, to charge the external capacitor $C_{external}$ and the slave device's internal capacitor $C_{internal}$. Further, the push-pull circuit is configured to transfer data symbols when the supply transistor $PMOS_{supply}$ is off and the data transistor $NMOS_{data\_master}$ is on.

The coding used to transmit data symbols, which could be a bitstream, in the exemplary embodiment is "Pulse Position Coding," which is alternatively known as "Modified Miller" coding. This is the most energy efficient coding that can be applied to a single wire interface 130, and it is possible to transfer both power and data symbols via the single wire interface 130. If only data is transferred, communication from slave device 120 to master device 110 may be performed using an alternative coding protocol, such as non-return to zero.

With Modified Miller coding in communication from the master device 110 to the slave device 120, when a data symbol having a value of "1" is to be transmitted, a modulation occurs, that is, the data transistor $NMOS_{data\_master}$ pulls the voltage on the single line interface 130 down to supply voltage VSS. Alternatively, when a data symbol having a value of "0" is to be transmitted, no modulation occurs, that is, the data transistor $NMOS_{data\_master}$ does not change the voltage on the single line interface 130.

When the slave device 120 transmits data symbols to the master device 110, the pull-down transistor $NMOS_{data\_slave}$ is turned on. Similar to the master device 110, when a data symbol having a value of "1" is to be transmitted, a modulation occurs, that is, the pull-down transistor $NMOS_{data\_slave}$ pulls the voltage on the single line interface 130 down to supply voltage VSS, and when transmitting a data symbol having a value of "0" leaves the voltage on the single line interface 130 at a high level.

A disadvantage of the system 100 occurs during communication from slave device 120 to master device 110. If the slave device 120's pull-down transistor $NMOS_{data\_slave}$ is switched on for data communication while the master device 110's supply transistor $PMOS_{supply}$ is also switched on, the result is a short circuit from supply voltage VCC to source voltage VSS. To rectify this situation, when slave device 120's pull-down transistor $NMOS_{data\_slave}$ is switched on, the master device 110's supply transistor $PMOS_{supply}$ is switched off. The push-pull circuit having both the supply transistor $PMOS_{supply}$ and the data transistor $NMOS_{data\_master}$ switched off is known as being in a tristate phase (or high ohmic state or weak pull-up state). The single wire interface 130 is then in an open circuit or undefined state permitting the slave device 120 to determine whether the voltage on the single wire interface 130 is high or low.

The diode D prevents the internal capacitor $C_{internal}$ of the slave device 120 from discharging when the voltage on the single wire interface 130 is modulated and the external capacitor $C_{external}$ is being discharged. After the modulation stops, the external capacitor $C_{external}$ is charged again until the voltage on the single wire interface 130 is higher than the internal voltage VDD of the internal capacitor $C_{internal}$. Next the modulation starts again, and the discharge and charge phases repeat.

The optional internal supply transistor $PMOS_{data\_slave}$ is coupled in parallel with the diode D and is configured to keep the external line capacitor $C_{external}$ charged. This optional internal supply transistor $PMOS_{data\_slave}$ receives the same input as the pull-down transistor $NMOS_{data\_slave}$. When a data symbol "1" is being transmitted, the pull-down transistor $NMOS_{data\_slave}$ modulates the voltage on the single wire interface 130 to a voltage level of voltage source VSS, and the internal supply transistor $PMOS_{data\_slave}$ is switched off. But when a data symbol "0" is being transmitted, the pull-down transistor $NMOS_{data\_slave}$ does not modulate, and the internal supply transistor $PMOS_{data\_slave}$ is switched on. The internal supply transistor $PMOS_{data\_slave}$ when switch on permits a voltage to charge the internal capacitor $C_{internal}$ to a voltage level defined by the slave device 120.

The optional resistor R is coupled between the single wire interface 130 and a supply voltage VCC. When the supply transistor $PMOS_{supply}$ is switched off, there is a weak pull-up phase and the single wire interface 130 is floating. The resistor R, having a value of, for example, 10-100 kΩ, acts as a pull-up resistor to prevent the single wire interface 130 from floating.

As an alternative to the optional resistor R, the master device 110 may have an optional weak supply transistor $PMOS_{weak}$ coupled in parallel to the supply transistor $PMOS_{supply}$ to prevent the single wire interface 130 from floating. The supply transistor $PMOS_{supply}$ is a strong pull-up, whereas the weak supply transistor $PMOS_{weak}$ is a weak pull-up.

Figure 2:
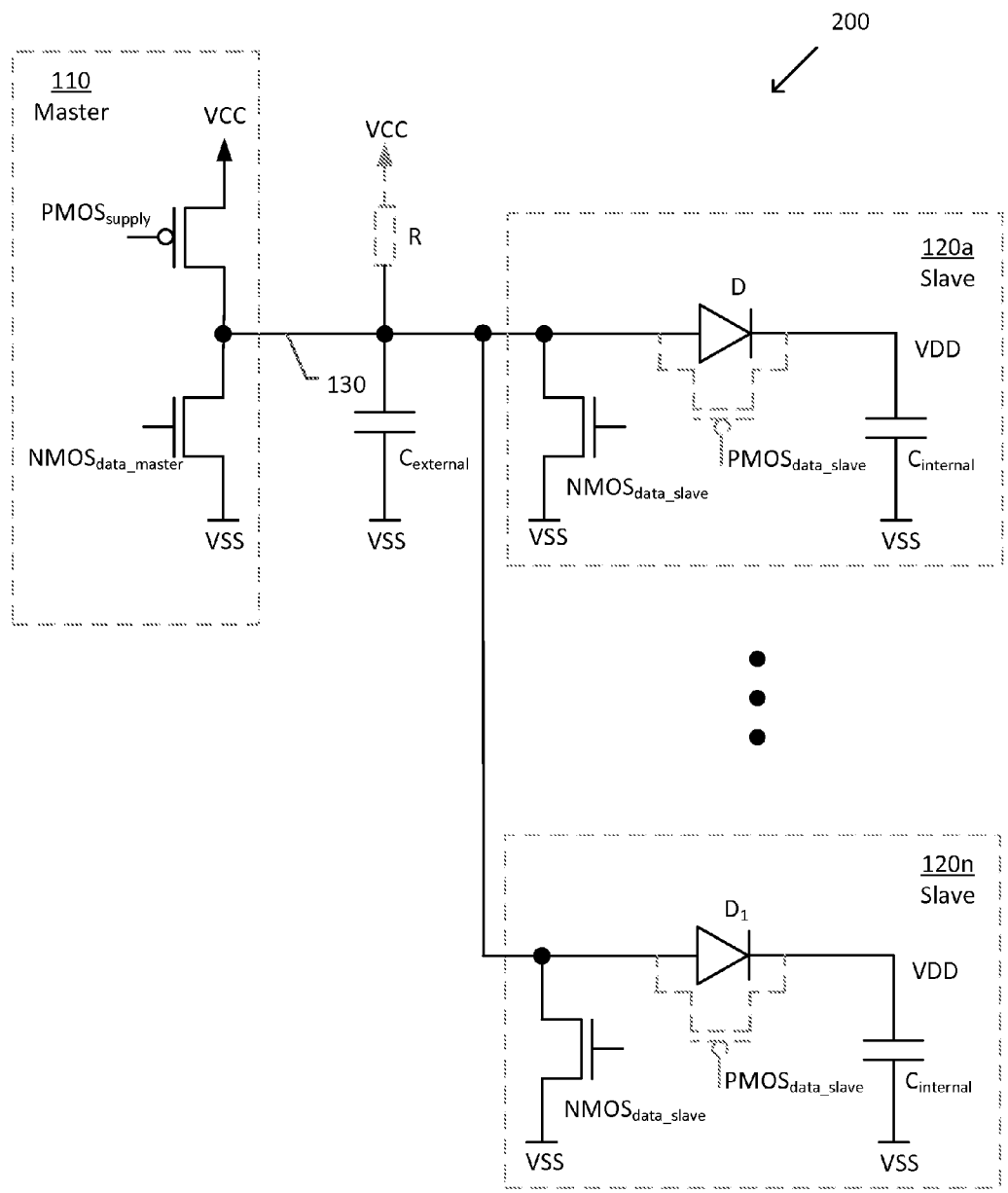
FIG. 2 illustrates a circuit diagram of a system in accordance with another exemplary embodiment.

FIG. 2 illustrates a circuit diagram of a system 200 in accordance with another exemplary embodiment.

System 200 is similar to system 100 shown in FIG. 1, except that system 200 has a plurality of slave devices 120a ... 120n coupled in parallel to the master device 110 via the single wire interface 130.

Figure 3A:
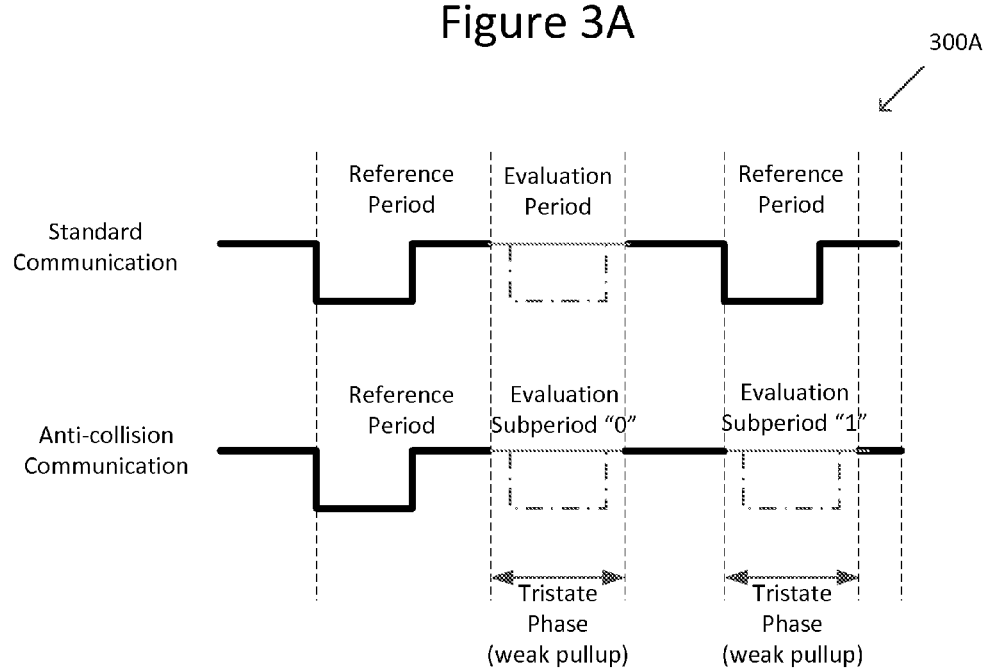
FIG. 3A illustrates a graph of slave to master device communication in accordance with an exemplary embodiment.

FIG. 3A illustrates a graph 300A of slave to master device communication in accordance with an exemplary embodiment. There are two different communication modes—standard communication and anti-collision communication.

The master device 110 and slave device 120 are not on the same chip, and thus their internal clocks are not synchronous. The internal clocks are synchronized by the master device 110 transmitting a synchronization symbol to initialize a time frame during which the master device 110 is not driving, that is, during a tristate phase or weak supply phase when the master device 110 has the optional weak supply transistor $PMOS_{weak}$ instead of or in additional to the optional pull-up resistor R, as discussed above. The slave device 120 receives the synchronization symbol, and then counts with its internal clock to determine this time frame during which it may communicate data symbols to the master device 110.

More specifically, during standard communication from the slave device 130 to the master device 110, the push-pull circuit of the master device 110 transmits over the single wire interface 130, a synchronization symbol indicating a beginning of a reference (first) period. The slave device 120 knows that this synchronization symbol defines the timing of the evaluation period to follow, during which the slave device 120 can pull down the voltage on the single wire interface 130 without harm to the supply voltage VCC of the overall system 100.

In response to receiving the synchronization symbol, the slave device 120 may transmit a data symbol to the master device 110 during an evaluation (second) period following the reference period. The evaluation period occurs when the push-pull circuit of the master device 110 is in the tristate phase, that is during a period of weak driving or high ohmic pull-up, during which the slave device 120 may pull the voltage on the single wire interface 130 to voltage source VSS. If this pull-down is detected by the master device 110, in the exemplary embodiment the response is interpreted as a "1", and otherwise as a "0", though the disclosure is not limited in this respect. As discussed above, during the reference period the push-pull circuit of the master device 110 is in a pull state, and during the evaluation period the push-pull circuit is in a tristate phase.

In the graph 300A, the reference period involves communication of the synchronization symbol from the master device 110 to the slave device 120 represented by the thick line. During this period the slave device 120 is monitoring the single wire interface 130 and measuring a transient from high to low and low to high. Dependent on the transient state, the slave device 120 then starts communication.

The evaluation period, which follows the reference period, involves communication from the slave device 120 to the master device 110 during the weak pull-up or tristate phase represented by the thin and by the dotted lines. The thin line represents the master device 110 observing the single wire interface 130 rather than driving data/reference symbols. The dashed line represents the internal supply transistor $PMOS_{data\_slave}$ of the slave device 120 pulling down the voltage of the single wire interface 130. During this weak phase the master device 110 is monitoring the single wire interface 130.

Anti-collision communication, as opposed to standard communication, allows multi-slave device 120a ... 120n support, such as in the system 200 of FIG. 2, by overcoming the problem of multiple slave devices 120 responding at the same time. In other words, a situation could arise in which multiple slave devices 120 respond at the same time, with one slave device 120 leaving the single wire interface 130 at a high voltage level, and another slave device 120 pulling to a low voltage level, in which case the master device 110 sees only the pull to low. The anti-collision communication protocol is designed to overcome this problem.

At the start of communication the master device 110 may transmit to the slave devices 120 an anti-collision command, and then the slave devices 120a ... 120n respond by communicating according to an anti-collision protocol. This protocol allows the master device 110 to sort between the slave devices 120a ... 120n. Subsequent to performing the anti-collision protocol, the master device 110 can use standard communication to communicate with a single slave device 120.

In anti-collision communication in accordance with this exemplary embodiment, the reference period is followed by a plurality of evaluation subperiods (e.g., subperiod "0" and subperiod "1") corresponding to respective values of data symbols (e.g., "0" and "1"). In other words, the evaluation period is split into multiple evaluation subperiods.

The one or more slave devices 120 transmit during one of the plurality of evaluation subperiods corresponding to a value of the data symbol being transmitted. More specifically, if a slave device 120 is transmitting a data symbol having a value of "0", the slave device modulates during the evaluation subperiod "0", and the master device 110 then knows the slave device 120 is transmitting a data symbol "0". Alternatively, if the slave device 120 is transmitting a data symbol having a value of "1", the slave device modulates during the evaluation subperiod "1", and the master device 110 then knows the slave device 120 is transmitting a data symbol "1". Two different slave devices 120 can therefore communicate two different data symbols, "0" and "1" respectively. A disadvantage of the anti-collision algorithm is that the bitrate is reduced to accommodate the multiple evaluation subperiods.

In the standard communication discussed above, a modulation during the single evaluation period means the slave device 120 is transmitting a data symbol "01" and no modulation means a data symbol "0". In anti-collision communication, on the other hand, the slave device 120 always modulates, just at a different evaluation subperiod corresponding with the value of the data symbol being transmitted.

There is the possibility that more than one slave device 120 communicates a same data symbol, in which case a known anti-collision algorithm using the slave devices' 120 identifications can be performed to distinguish the communications between the multiple slave devices 120. This anti-collision algorithm is outside the scope of this disclosure, and therefore its detailed description will not be provided here.

Figure 3B:
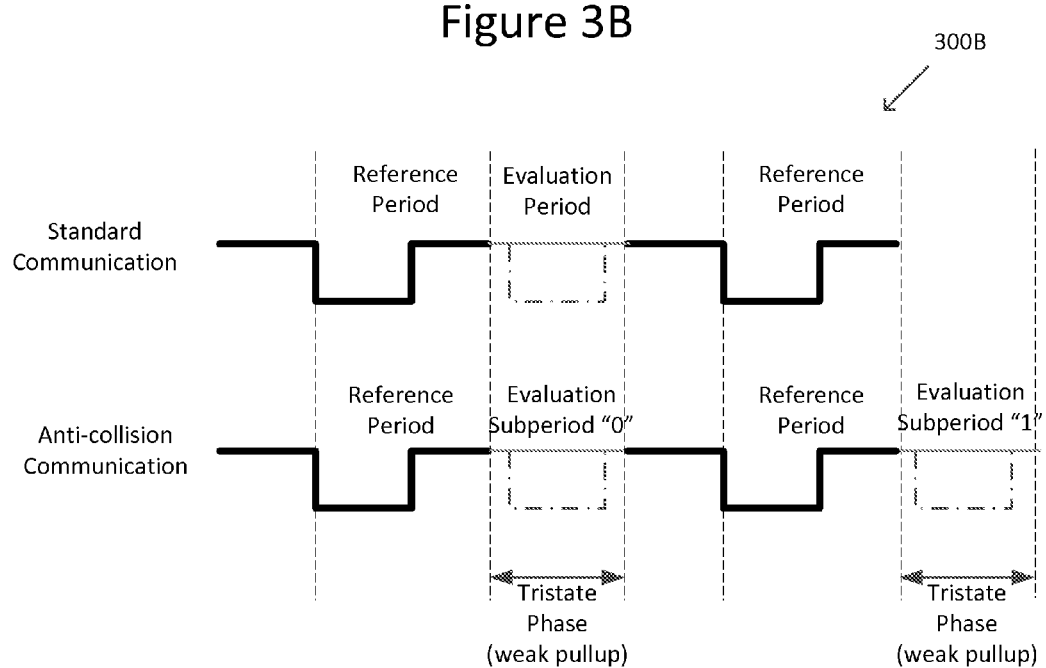
FIG. 3B illustrates a graph of slave to master device communication in accordance with another exemplary embodiment.

FIG. 3B illustrates a graph of slave device to master device communication in accordance with another exemplary embodiment.

The standard communication between the master device 110 and the slave device 120 shown is the same as that of FIG. 3A, so its description need not be repeated here.

The anti-collision communication of FIG. 3B differs from that of FIG. 3A in that rather than having a single reference period for the plurality of evaluation subperiods, there is a reference subperiod for each of the respective evaluation subperiods. More specifically, each of the plurality of evaluation subperiods follows a respective one of the plurality of reference subperiods. As with the anti-collision communication of FIG. 3A, the one or more slave devices 120 transmits during one of the plurality of evaluation subperiods corresponding to a value of the data symbol being transmitted. More specifically, if a slave device 120 is transmitting a data symbol having a value of "0", the slave device transmits during evaluation period "0", and alternatively, if the slave device 120 is transmitting a data symbol having a value of "1", the slave device transmits during evaluation period "1".

FIGS. 3A and 3B illustrate slave to master device communication in accordance with exemplary embodiments involving a reference period. Communication from the master device 110 to the slave device 120 does not require such a reference period.

Also, the exemplary embodiments are described in the context of Modified Miller coding of binary data to form a two-level signal where a data symbol "0" result in no change of voltage level unless it is followed by another "0", in which case a transition to the other level takes place at the end of the period; and a data symbol "1" causes a transition from one level to the other in the middle of the period. The disclosure is not limited in this respect. The coding used may be any coding suitable for the intended purpose.

Figure 4:
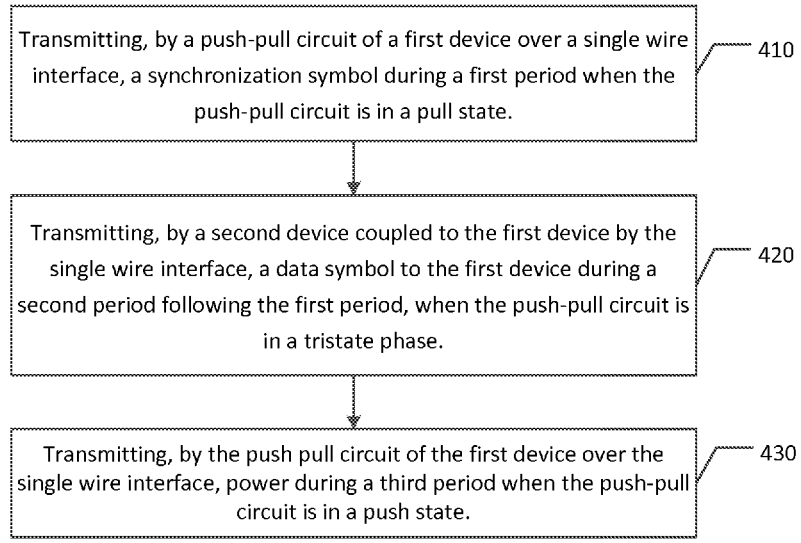
FIG. 4 illustrates a flowchart of a method in accordance with an exemplary embodiment.

FIG. 4 illustrates a flowchart 400 of a method in accordance with an exemplary embodiment.

At Step 410, a push-pull circuit of the master (first) device 110 transmits over the single wire interface 130, a synchronization symbol during a first period when the push-pull circuit is in a pull state.

At Step 420, the slave (second) device 120, which is coupled to the master device 110 by the single wire interface 130, transmits a data symbol to the master device 110 during a second period following the first period when the push-pull circuit is in a tristate phase.

At Step 430, the push-pull circuit of the master device 110 transmits over the single wire interface 130, power during a third period when the push-pull circuit is in a push state. Step 430 may occur after Steps 410 and 420, or alternatively, before Steps 410 and 420.

Although exemplary embodiments have been illustrated and described herein, it will be appreciated by those of ordinary skill in the art that a variety of alternate and/or equivalent implementations may be substituted for the specific embodiments shown and described without departing from the scope of the disclosure. This disclosure is intended to cover any adaptations or variations of the exemplary embodiments discussed herein. For example, any signal discussed herein may be scaled, buffered, scaled and buffered, converted to another state (e.g., voltage, current, charge, time, etc.), or converted to another state (e.g., from high to low and low to high) without materially changing the underlying method. Further, bipolar transistors (e.g., PNP or NPN) can be used instead of MOS transistors. A PNP may be used instead of NPN and visa versa, and a PMOS may be used instead of NMOS and visa versa. Accordingly, it is intended that the disclosure be limited only in terms of the appended claims.

What is claimed is:

1. A system, comprising:
   a first device having a push-pull circuit configured to transmit a synchronization symbol; and
   a second device coupled to the first device by a bidirectional single wire interface, and configured to, in response to receiving the synchronization symbol from the first device via the single wireless interface, transmit a data symbol to the first device via the single wireless interface while the push-pull circuit is in a tristate phase.

2. The system of claim 1, wherein data symbols and power are transmitted via the bidirectional single wire interface.

3. The system of claim 1, wherein the push-pull circuit comprises:
   a supply transistor coupled between a supply voltage and the bidirectional single wire interface, and configured to provide power to the second device when the supply transistor is on; and
   a data transistor coupled between the bidirectional single wire interface and a source, and configured to transmit a data symbol and/or the synchronization symbol to the second device when the data transistor is on,
   wherein the supply and data transistors have opposing polarities.

4. The system of claim 3, wherein during the tristate phase both the supply and data transistors are turned off.

5. The system of claim 3, wherein the supply transistor is a PMOS transistor, and the data transistor is an NMOS transistor.

6. The system of claim 1, wherein
the first device is further configured to transmit the synchronization symbol during a first period when the push-pull circuit is in a pull state, and
the second device is further configured to transmit the data symbol during a second period following the first period when the push-pull circuit is in the tristate phase.

7. The system of claim 1, further comprising:
a plurality of second devices coupled in parallel to the first device via the bidirectional single wire interface.

8. The system of claim 3, wherein the second device comprises a pull-down transistor coupled between the bidirectional single wire interface and the source, and is configured to transmit the data symbol.

9. The system of claim 8, wherein the second device further comprises:
an internal capacitor; and
a diode coupled between the bidirectional single wire interface and the internal capacitor, and configured to hinder the internal capacitor from discharging.

10. The system of claim 9, wherein the second device further comprises a transistor coupled in parallel with the diode, and configured to supply or charge the line capacitor.

11. The system of claim 1, further comprising:
an external capacitor coupled between the bidirectional single wire interface and the source.

12. The system of claim 1, further comprising a pull-up resistor or weak supply transistor coupled between the bidirectional single wire interface and a supply voltage, and configured to prevent the bidirectional single wire interface from floating.

13. A method, comprising:
transmitting, by a push-pull circuit of a first device over a bidirectional single wire interface, a synchronization symbol during a first period;
transmitting, by a second device coupled to the first device by the bidirectional single wire interface, a data symbol to the first device during a second period following the first period,
wherein during the first period the push-pull circuit is in a pull state, and during the second period the push-pull circuit is in a tristate phase.

14. The method of claim 13, wherein:
the second period comprises a plurality of second subperiods corresponding to respective values of data symbols, and
the transmitting by the second device occurs during one of the plurality of second subperiods corresponding to a value of the data symbol being transmitted.

15. The method of claim 13, wherein:
the first period comprises a plurality of first subperiods,
the second period comprises a plurality of second subperiods corresponding to respective values of data symbols, each of the plurality of second subperiods following a respective one of the plurality of first subperiods, and
the transmitting by the second device occurs during one of the plurality of second subperiods corresponding to a value of the data symbol being transmitted.

16. The method of claim 13, further comprising:
transmitting, by the push pull circuit of the first device over the bidirectional single wire interface, power during a third period when the push-pull circuit is in a push state.

17. A master device, comprising a push-pull circuit configured to transmit a synchronization symbol to a slave device via a bidirectional single wire interface while the push-pull circuit is in a pull state, and, in response to the synchronization symbol, to receive a data symbol via the bidirectional single wire interface from the slave device while the push-pull circuit is in a tristate phase or in a weak supply phase.

18. The master device of claim 17, wherein data symbols and power are transmitted via the bidirectional single wire interface.

19. The master device of claim 17, wherein the push-pull circuit comprises:
a supply transistor coupled between a supply voltage and the bidirectional single wire interface, and configured to provide power to the slave device when the supply transistor is on; and
a data transistor coupled between the bidirectional single wire interface and a source, and configured to transmit a data symbol and/or the synchronization symbol to the slave device when the data transistor is on,
wherein the supply and data transistors have opposing polarities.

20. The master device of claim 19, wherein during the tristate phase both the supply and data transistors are turned off.

* * * * *